United States Patent
Medard et al.

(10) Patent No.: US 11,451,247 B2
(45) Date of Patent: Sep. 20, 2022

(54) DECODING SIGNALS BY GUESSING NOISE

(71) Applicants: Massachusetts Institute of Technology, Cambridge, MA (US); National University of Ireland, Maynooth, Maynooth (IE)

(72) Inventors: Muriel Medard, Belmont, MA (US); Kenneth R. Duffy, Dublin (IE)

(73) Assignees: Massachusetts Institute of Technology, Cambridge, MA (US); National University of Ireland, Maynooth, Maynooth (IE)

(*) Notice: Subject to any disclaimer, the term of this patent is extended or adjusted under 35 U.S.C. 154(b) by 0 days.

(21) Appl. No.: 17/371,925

(22) Filed: Jul. 9, 2021

(65) Prior Publication Data

US 2022/0014214 A1    Jan. 13, 2022

Related U.S. Application Data

(63) Continuation of application No. 16/793,224, filed on Feb. 18, 2020, now Pat. No. 11,095,314, which is a
(Continued)

(51) Int. Cl.
*H03M 13/29* (2006.01)
*H04L 1/00* (2006.01)
(Continued)

(52) U.S. Cl.
CPC ....... *H03M 13/2951* (2013.01); *H03M 13/05* (2013.01); *H03M 13/2906* (2013.01);
(Continued)

(58) Field of Classification Search
CPC ............. H03M 13/2951; H03M 13/05; H03M 13/2906; H03M 13/2927; H03M 13/37;
(Continued)

(56) References Cited

U.S. PATENT DOCUMENTS

| 6,138,264 A | 10/2000 | Nava et al. |
| 6,511,280 B1 | 1/2003 | Sammartino et al. |

(Continued)

FOREIGN PATENT DOCUMENTS

| EP | 1819058 17 | 8/2007 |
| JP | 2003283341 A | * 10/2003 |
| WO | WO 2021/115670 A1 | 6/2021 |

OTHER PUBLICATIONS

U.S. Appl. No. 17/636,587, filed Feb. 18, 2022, Duffy.
(Continued)

*Primary Examiner* — Kyle Vallecillo
(74) *Attorney, Agent, or Firm* — Daly, Crowley, Mofford & Durkee LLP

(57) ABSTRACT

Devices and methods described herein decode a sequence of coded symbols by guessing noise. In various embodiments, noise sequences are ordered, either during system initialization or on a periodic basis. Then, determining a codeword includes iteratively guessing a new noise sequence, removing its effect from received data symbols (e.g. by subtracting or using some other method of operational inversion), and checking whether the resulting data are a codeword using a codebook membership function. This process is deterministic, has bounded complexity, asymptotically achieves channel capacity as in convolutional codes, but has the decoding speed of a block code. In some embodiments, the decoder tests a bounded number of noise sequences, abandoning the search and declaring an erasure after these sequences are exhausted. Abandonment decoding nevertheless approximates maximum likelihood decoding within a tolerable bound and achieves channel capacity when the abandonment threshold is chosen appropriately.

14 Claims, 7 Drawing Sheets

Related U.S. Application Data continuation of application No. 16/026,822, filed on Jul. 3, 2018, now Pat. No. 10,608,673.

(60) Provisional application No. 62/631,104, filed on Feb. 15, 2018, provisional application No. 62/609,765, filed on Dec. 22, 2017.

(51) Int. Cl.
  *H03M 13/05* (2006.01)
  *H03M 13/00* (2006.01)
  *H03M 13/37* (2006.01)

(52) U.S. Cl.
  CPC ....... *H03M 13/2927* (2013.01); *H03M 13/37* (2013.01); *H03M 13/3746* (2013.01); *H03M 13/6337* (2013.01); *H04L 1/005* (2013.01); *H04L 1/0045* (2013.01); *H04L 1/0054* (2013.01); *H04L 1/0065* (2013.01); *H04L 1/0057* (2013.01)

(58) Field of Classification Search
  CPC .......... H03M 13/3746; H03M 13/6337; H04L 1/0045; H04L 1/005; H04L 1/0054; H04L 1/0065; H04L 1/0057
  See application file for complete search history.

(56) References Cited

U.S. PATENT DOCUMENTS

| | | |
|---|---|---|
| 6,625,226 B1 | 9/2003 | Gersho et al. |
| 7,209,867 B2 | 4/2007 | Vigoda et al. |
| 7,860,687 B2 | 12/2010 | Vigoda et al. |
| 8,479,085 B2 | 7/2013 | Jo et al. |
| 8,851,382 B2 | 10/2014 | Powers et al. |
| 9,246,156 B2 | 1/2016 | Kwag et al. |
| 9,432,059 B1 | 8/2016 | Sakamoto |
| 9,769,003 B2 | 9/2017 | Bogdan |
| 9,998,148 B2 | 6/2018 | Lin et al. |
| 10,311,243 B2 | 6/2019 | Calmon et al. |
| 10,491,432 B1 | 11/2019 | Medra et al. |
| 10,608,672 B2 | 3/2020 | Medard et al. |
| 10,608,673 B2 | 3/2020 | Medard et al. |
| 10,944,610 B2 | 3/2021 | Medard et al. |
| 11,095,314 B2 | 8/2021 | Medard et al. |
| 2002/0046382 A1 | 4/2002 | Yang |
| 2002/0154716 A1 | 10/2002 | Erving et al. |
| 2002/0161560 A1 | 10/2002 | Abe et al. |
| 2003/0186659 A1 | 10/2003 | Kolze |
| 2004/0264555 A1 | 12/2004 | Hegde et al. |
| 2005/0281348 A1 | 12/2005 | Kim |
| 2006/0070256 A1 | 4/2006 | Weissman et al. |
| 2006/0070257 A1 | 4/2006 | Weissman et al. |
| 2006/0123277 A1 | 6/2006 | Hocevar |
| 2006/0224307 A1 | 10/2006 | Schmidt et al. |
| 2007/0011568 A1 | 1/2007 | Hocevar |
| 2007/0041458 A1 | 2/2007 | Hocevar et al. |
| 2007/0086539 A1 | 4/2007 | Hocevar |
| 2008/0075206 A1 | 3/2008 | Ordentlich et al. |
| 2009/0249159 A1 | 10/2009 | Lee et al. |
| 2010/0074319 A1 | 3/2010 | Tseng et al. |
| 2010/0223534 A1 | 9/2010 | Earnshaw et al. |
| 2011/0072330 A1 | 3/2011 | Kolze |
| 2014/0146969 A1 | 5/2014 | Sadot et al. |
| 2015/0236726 A1 | 8/2015 | Sankaranarayanan et al. |
| 2016/0329978 A1 | 11/2016 | Zukunft et al. |
| 2017/0134193 A1 | 5/2017 | Sugihara |
| 2018/0226999 A1 | 8/2018 | Wang et al. |
| 2018/0254882 A1 | 9/2018 | Bogdan |
| 2019/0036550 A1* | 1/2019 | Koike-Akino ...... H03M 13/451 |
| 2019/0116560 A1 | 4/2019 | Naderializadeh et al. |
| 2019/0188255 A1* | 6/2019 | Mahmoud ............ G06F 40/129 |
| 2019/0199473 A1 | 6/2019 | Medard et al. |
| 2019/0260441 A1 | 8/2019 | Akuon et al. |
| 2020/0106506 A1 | 4/2020 | Bhamidipati et al. |
| 2021/0288685 A1 | 9/2021 | Medard et al. |
| 2021/0384918 A1 | 12/2021 | Solomon et al. |

OTHER PUBLICATIONS

International Preliminary Report on Patentability dated Jul. 2, 2020 for International Application No. PCT/US2018/066810; 8 Pages.

International Preliminary Report on Patentability dated Jul. 2, 2020 for International Application No. PCT/US2018/066813; 8 Pages.

Notice of Allowance dated Dec. 4, 2019 for U.S. Appl. No. 16/026,822; 5 pages.

Notice of Allowance dated Dec. 17, 2019 for U.S. Appl. No. 16/026,811; 7 pages.

Notice of Allowance dated Dec. 11, 2020 for U.S. Appl. No. 16/765,083; 13 Pages.

Notice of Allowance dated Apr. 12, 2021 for U.S. Appl. No. 16/793,224; 8 Pages.

U.S. Non-Final Office Action dated Aug. 14, 2019 for U.S. Appl. No. 16/026,811; 9 Pages.

U.S. Non-Final Office Action dated Oct. 28, 2019 for U.S. Appl. No. 16/026,822; 11 pages.

U.S. Non-Final Office Action dated Oct. 29, 2020 for U.S. Appl. No. 16/765,083; 12 Pages.

U.S. Non-Final Office Action dated Feb. 4, 2021 for U.S. Appl. No. 16/793,224; 20 Pages.

PCT International Search Report dated Apr. 4, 2019, for Application No. PCT/US2018/066810; 5 Pages.

PCT Written Opinion of the International Searching Authority dated Apr. 4, 2019, for Application No. PCT/US2018/066810; 9 Pages.

PCT International Search Report dated Apr. 4, 2019, for Application No. PCT/US2018/066813; 5 Pages.

PCT Written Opinion of the International Searching Authority dated Apr. 4, 2019, for Application No. PCT/US2018/066813; 9 Pages.

Response to Office Action dated Aug. 14, 2019 for U.S. Appl. No. 16/026,811, filed Oct. 4, 2019; 5 Pages.

Response to Office Action dated Oct. 28, 2019 for U.S. Appl. No. 16/026,822, filed Nov. 7, 2019; 2 pages.

Response to Office Action dated Oct. 29, 2020 for U.S. Appl. No. 16/765,083, filed Dec. 1, 2020; 7 Pages.

Response to U.S. Non-Final Office Action dated Feb. 4, 2021 for U.S. Appl. No. 16/793,224; Response filed on Mar. 31, 2021; 7 Pages.

Communication Pursuant to Rules 161(1) and 162 EPC for European Application No. 18834223.2 dated Jul. 29, 2020; 3 Pages.

Response (with amended claims and descriptions) to Communication Pursuant to Rules 161(1) and 162 EPC for European Application No. 18834223.2 dated Jul. 29, 2020; Response filed on Oct. 23, 2020; 22 Pages.

Communication Under Rule 71(3) EPC Intention to Grant for European Application No. 18834223.2 dated Oct. 5, 2021; 7 Pages.

International Search Report and Written Opinion dated Jun. 30, 2021 for International Application No. PCT/US21/26412; 8 Pages.

International Search Report and Written Opinion for International Patent Application No. PCT/EP2020/079671 dated Jan. 18, 2021; 20 Pages.

Abou-Faycal, et al.; "Binary Adaptive Coded Pilot Symbol Assisted Modulation Over Rayleigh Fading Channels Without Feedback"; IEEE Transactions on Communications; vol. 53; No. 6; pp. 1036-1046; Jun. 2005; 11 Pages.

Akin, et al.; "Training Optimization for Gauss-Markov Rayleigh Fading Channels"; IEEE Communication Society; pp. 5999-6004; Jan. 2007; 6 Pages.

Anderson, et al.; "Optimal Filtering"; IEEE Transactions on Systems, Man, and Cybernetics; vol. SMC-12; No. 2; pp. 235-236; Mar./Apr. 1982; 2 Pages.

Arikan; "Channel Polarization: A Method for Constructing Capacity-Achieving Codes"; ISIT 2008; pp. 1173-1177; Jul. 6-11, 2008; 5 Pages.

Tillich, Jean-Pierre; "Lecture 8: Polar Codes"; Information Theory; Nov. 18, 2016; 41 Pages.

(56) References Cited

OTHER PUBLICATIONS

Azar, et al.; "On the Equivalence Between Maximum Likelihood and Minimum Distance Decoding Binary Contagion and Queue-Based Channels with Memory;" IEEE Transactions on Communication; vol. 63; No. 1; Jan. 2011; 10 pages.
Campos; "Understanding the 5G NR Physical Layer;" Keysight Technologies; Nov. 1, 2017; 111 Pages.
Chase, "A Class of Algorithms for Decoding Block Codes with Channel Measurement Information"; IEEE Transactions on Information Theory, vol. IT-18, No. 1; Jan. 1972; 13 Pages.
Duffy et al., "Guessing Random Additive Noise Decoding with Symbol Reliability Information (SRGRAND)"; https://arxiv.org/; Nov. 25, 2019; 18 Pages.
Duffy, "Ordered Reliability Bits Guessing Random Additive Noise Decoding"; https://arxiv.org/; Jan. 2, 2020; 6 Pages.
Duffy, et al. "Capacity-achieving Guessing Random Additive Noise Decoding (GRAND)"; arXiv:1802.07010v4; Cornell University Library; Feb. 20, 2018; 21 Pages.
Duffy, et al.; "Guessing noise, not code-words"; 2018 IEEE International Symposium on Information Theory (ISIT); Jun. 17-22, 2018; 5 Pages.
Etsi; "5G; NR; Physical layer procedures for control"; 3 GPP TS 38.213 version 15.2.0 Release 15; Jul. 2018; 101 Pages.
Gallager; "A Perspective on Multiaccess Channels"; IEEE Transactions on Information Theory; vol. IT-31; No. 2; Mar. 1985; pp. 124-142; 19 Pages.
Kavcic, et al.; "The Viterbi Algorithm and Markov Noise Memory"; IEEE Transactions on Information Theory; vol. 46; No. 1; pp. 291-301; Jan. 1, 2000; 11 Pages.
Kaye, et al.; "Relationship Between LMS Compensators for Intersymbol Interference in Linear and Nonlinear Modulation Schemes"; IEEE Transactions on Information Theory; pp. 244-246; Mar. 1973; 3 Pages.
Li, et al.; "A Successive Decoding Strategy for Channels with Memory"; IEEE Transactions on Information Theory; vol. 53; Issue 2; Jan. 22, 2007; 5 Pages.
Li, et al.; "Approaching Capacity on Noncoherent Block Fading Channels with Successive Decoding"; IEEE ICC; pp. 1416-1420; Jan. 2006; 5 Pages.
Li, et al.; "Design and Analysis of Successive Decoding with Finite Levels for the Markov Channels"; May 5, 2009; 22 Pages.
Li, et al.; "Successive Decoding for Finite State Markov Modelled Flat Fading Channels"; ISIT 2006; Jul. 9-14, 2006; 5 Pages.
Liang, et al.; "Hardware Efficient and Low-Latency CA-SCL Decoder Based on Distributed Sorting"; Jan. 2016; 6 Pages.
Mani, "Symbol-Level Stochastic Chase Decoding of Reed-Solomon and BCH Code"; IEEE Transactions on Communications, vol. 67, No. 8, Aug. 2019; 12 Pages.
Medard, et al.; "Bandwidth Scaling for Fading Multipath Channels"; IEEE Transactions on Information Theory; vol. 48; No. 4; pp. 840-851; Apr. 2002; 13 Pages.
Narayanan, et al.; "A BCJR-DFE Based Receiver for Achieving Near Capacity Performance on Inter Symbol Interference Channels"; Jan. 2004; 10 Pages.
Nevat, et al.; "Channel Tracking Using Pruning for MIMO-OFDM Systems Over Gaus-Markov Channels"; ICASS; III-196-III-196; Jan. 2007; 4 Pages.
Niu, et al.; "CRC-Aided Decoding of Polar Codes"; IEEE Communications Letters; vol. 16; No. 10; pp. 1668-1671; Oct. 2012; 4 Pages.
Silverman et al.; "Coding for Constant-Data-Rate Systems"; IRE Professional Group on Information Theory, IEEE, vol. 4, No. 4; Sep. 1, 1954; 14 Pages.
Solomon et al.; "Soft Maximum Likelihood Decoding using GRAND", [online] InICC 2020-2020, IEEE International Conference on Communications (ICC); Jan. 9, 2020; 6 Pages.
Stimming, et al.; "LLR-Based Successive Cancellation List Decoding of Polar Codes"; IEEE Transactions on Signals Processing; vol. 63; No. 19; pp. 5165-5179; Oct. 1, 2015; 15 Pages.
Tal, et al.; "List Decoding of Polar Codes"; 2011 IEEE International Symposium on Information Theory Proceedings; pp. 1-5; Jan. 2011; 5 Pages.
Yang; "A Road to Future Broadband Wireless Access: MIMO-OFDM-Based Air Interface"; Wireless Communications In China: Technology VS. Markets; IEEE Communications Magazine; pp. 53-60; Jan. 2005; 8 Pages.
Valembois, Antoine et al. "An Improved Method to Compute Lists of Binary Vectors that Optimize a Given Weight Function with Application to Soft-Decision Decoding" IEEE Communications Letters, vol. 5, No. 11; Nov. 2001; 3 Pages.

\* cited by examiner

DECODING SIGNALS BY GUESSING NOISE

CROSS-REFERENCE TO RELATED APPLICATIONS

This application is a continuation of application Ser. No. 16/793,224 filed Feb. 18, 2020, which is a continuation of application Ser. No. 16/026,822 filed Jul. 3, 2018, which claims the benefit of Provisional Application 62/609,765 filed Dec. 22, 2017 and Provisional Application 62/631,104 filed Feb. 15, 2018. The entire contents of these Applications are incorporated herein by reference.

BACKGROUND

Codes are known for converting information between different formats for different purposes. There are four generally recognized, broad purposes for coding: secrecy ("cryptography"), compression to reduce the space required to represent given data ("source coding"), formatting data for transmission over a physical medium ("line coding"), and formatting data to enable detection and correction of errors caused by unreliable storage or transmission mechanisms ("channel coding").

A channel may be a single physical medium ("link"), or a concatenation of multiple links. Each such link may introduce noise into data by operating upon it in a different manner or in the same manner; regardless, the effects of such noise may be mathematically modeled, and detected or corrected using channel codes. In channel coding, error detection schemes generally operate by adding data to be stored or transmitted, such as a parity bit, checksum, or result of applying a hash (bit-mixing) function. Error correction typically operates using either an error-correction code ("ECC"), error detection in combination with an automatic repeat request ("ARQ") requesting retransmission of additional data, or both. An ECC is usually either a block code that operates on independent, fixed-size data blocks (sometimes called "packets") or a convolutional code that corrects streams of data via a sliding window.

Decoding a block code as known in the art requires 'guessing' a codeword by determining the codeword in a code book having the smallest Hamming distance (i.e. number of changed bits) to the received data block. Decoding a convolutional code, by contrast, requires applying to the received stream of data more sophisticated data models (such as a Markov model) and algorithms (such as the Viterbi algorithm) that operate on a probabilistic basis rather than a deterministic one. Thus, decoding block codes is generally faster than decoding convolutional codes.

The Shannon-Hartley theorem states that the capacity C of a data channel (in bits per second) equals the bandwidth of the channel (in Hz) multiplied by the base 2 logarithm of (1 plus the signal-to-noise power ratio of the channel). The noisy-channel coding theorem states that, for a noisy data channel having channel capacity C, the maximum rate R at which data may be transmitted over that channel is the ratio of C to (1 minus the binary entropy function for an acceptable probability of bit error). Because of this latter theorem, codes exist that allow the probability of error at the receiver to be made arbitrarily small precisely when R<C; that is, when the ratio R/C (sometimes called the "code rate") is less than 1. Conversely, when the code rate is greater than 1, it is generally not possible to provide a code for which the probability of error at the receiver is arbitrarily small—decoding can still occur, albeit without sufficient data to prove that the decoded information is correct.

To achieve near-theoretical performance operate by a block code requires minimizing the binary entropy function, which in turn may require the block size to be arbitrarily large and thus computationally impractical. Thus, known systems using block codes do not approach channel capacity as closely as convolutional codes. Conversely, as noted above, known systems using convolutional codes do not decode as quickly as those using block codes.

SUMMARY OF DISCLOSED EMBODIMENTS

Systems, devices, and methods described herein decode a block code based on guessing noise, rather than guessing codewords directly. In various embodiments, noise sequences are ordered, either during system initialization or on a periodic basis. Then, determining a codeword includes guessing a noise sequence, removing its effect from a received data block (e.g. by subtracting or using some other method of operational inversion), and checking whether the resulting data are a codeword contained in a codebook. This process is deterministic with bounded complexity and approaches channel capacity with the decoding speed of a block code. Moreover, inverting a noise effect from a received signal does not require codeword arithmetic (e.g. syndrome computations), so decoding calculations advantageously may be separated from determining codeword membership in a codebook.

A decoder provided in accordance with the concepts described herein is advantageously suitable for use with any codebook. Thus, it can be used in conjunction with any existing codebook construction such as, for example, a random codebook, a random linear codebook, a standard linear codebook (Hamming Code-book, Low Density Parity Check (LDPC), etc.), as well as any forthcoming codebook construction. The random codebook may be created by using random linear codes (RLNCs), in which a codeword is generated from a plurality of symbols by multiplying that plurality, expressed as an ordered sequence over some algebraic ring, by a matrix over the same ring or some compatible ring, whose elements, or subset thereof, are chosen through some random process.

Furthermore, a decoder provided in accordance with the concepts described herein also is advantageously modular. By guessing noise and reversing its effects on received blocks of data, no syndrome computations are required. Rather, the decoder interacts with the codebook by way of requesting whether a given sequence of (guessed noise-adjusted) symbols is or is not a codeword, permitting codebook functions to be performed separately. This separation of functions simplifies the decoder design and permits opaque codeword oracles to be used, if desired. For example, an array of parallel decoders may avail themselves of a single codebook membership module.

Thus, one embodiment of the concepts, techniques, and systems described herein is a method, in a decoder, of decoding as a codeword a plurality of symbols received from a data sender using a noisy data channel. The method includes repeatedly performing three processes until a termination condition is obtained. The first process is selecting, by a noise guesser according to a noise guessing order, a sequence of noise symbols previously unselected for the received plurality of symbols. The second process is forming, in a buffer, a block of symbols by inverting a noise effect of the selected sequence of noise symbols on the received plurality of symbols. The third process is obtaining the termination condition, by a codeword validator, if the formed block of symbols is a codeword. In response to obtaining the termination condition, the method requires outputting, by a sent codeword outputter, the formed block of symbols as the decoded codeword.

Thus, one embodiment is a method, in a decoder, of decoding data that was encoded with an outer code then encoded with an inner code. The method includes receiving a collection of m pluralities of data symbols from a data sender using a noisy data channel, the number m being determined by the outer code. Then, for each received plurality of data symbols, the method includes repeatedly performing three processes until a termination condition is obtained.

The first process is selecting, by a noise guesser according to a noise guessing order, a sequence of noise symbols previously unselected for the given received plurality of data symbols. The second process is forming, in a buffer, a block of formed symbols by inverting a noise effect, of the selected sequence of noise symbols, on the given received plurality of data symbols. The third process is obtaining the termination condition, by a codeword validator, if the formed symbols comprise a codeword for the inner code.

The method further includes, when the termination condition is obtained for each received plurality of data symbols, storing in a memory the formed symbols as a codeword for the inner code. The method concludes, when the memory stores at least a number k of codewords for the inner code wherein the number k m is determined by the outer code, with collectively decoding the at least k stored codewords according to the outer code and outputting the decoded data.

Some embodiments include performing the method simultaneously by a plurality of distributed decoders, each distributed decoder decoding, with respect to the inner code, one or more of the m pluralities of data symbols received from the data sender.

In some embodiments, decoding according to the outer code comprises decoding one or more of: a maximum distance separable (MDS) block code capable of correcting m−k codeword erasures; an MDS block code capable of correcting m−k errors made by the codeword validator; a rateless code, wherein the data sender is capable to dynamically change the number m and to communicate the change to the decoder; and a code whose codewords comprise data symbols randomly chosen from an alphabet of symbols.

In some embodiments, either the outer code or the inner code comprises a network code. For example, the network code may be a concatenation of encodings. Alternatively, or in addition, the network code may be a random code, a random linear network code, a Hamming code, or a Low Density Parity Check code.

In some embodiments, obtaining the termination condition further comprises validating, by the codeword validator, the formed symbols using one or more of: validation information received from the data sender, a codebook memory, and a function taking the formed symbols as input and having a binary output.

In some embodiments, obtaining the termination condition further comprises validating, by the codeword validator, the formed symbols using a codebook oracle that verifies the decoding of the inner code according to one or more dependencies induced by the outer code.

In some embodiments, outputting, by the sent codeword outputter, comprises outputting either or both of an error signal and information pertaining to an error.

Some embodiments of the method further include incrementing a repetition count each time the codeword validator attempts to validate formed symbols for the given received sequence of data symbols; and obtaining the termination condition, by the codeword validator, when the repetition count reaches a first threshold. In such embodiments, obtaining the termination condition may include determining that the repetition count has reached at least a second threshold that is a function of a codebook rate, an estimated noise property, or both. Or, obtaining the termination condition includes determining that the codebook rate is greater than 1 due to a temporary decrease in channel capacity caused by transient noise. Or, obtaining the termination condition includes the codeword validator declaring an erasure for the inner code, in which case decoding the k stored codewords according to the outer code may include declaring an erasure for the outer code when the codeword validator has declared m+1−k erasures for the inner code.

In some embodiments, a node, that is intermediate the data sender and the decoder, performs a partial decoding and forwarding method. The forwarding method includes receiving a collection of m' pluralities of data symbols from the data sender or another such node using the noisy data channel, wherein the number m'≤m. The forwarding method then includes performing repeatedly performing the selecting, forming, and obtaining processes of the main method for each received plurality of data symbols. The forwarding method further includes, when the termination condition is obtained for each received plurality of data symbols, storing in a memory the formed symbols as a codeword for the inner code, just as with the main method. Finally, the forwarding method requires, when the memory stores at least a number k' of codewords for the inner code wherein the number k'≤m', transmitting the k' codewords to the decoder.

In some embodiments, the method of the intermediate node includes receiving soft information pertaining to at least one of the k' codewords for the inner code. In such embodiments, collectively decoding the at least k' stored codewords may include declaring an erasure.

In some embodiments, the method of the intermediate node includes recoding the outer code at a different rate, without decoding the outer code. In such embodiments, either or both of the outer code and the recoded outer code may be a random linear network code (RLNC).

Another embodiment of the concepts, techniques, and systems described herein is a decoder for decoding data that was encoded with an outer code then encoded with an inner code. The decoder includes a receiver for receiving each sequence of data symbols in the plurality from a noisy data channel. The decoder also includes a noise guesser for selecting, according to a noise guessing order, a sequence of noise symbols previously unselected for each given received sequence of data symbols. The decoder further has a buffer for storing symbols formed by inverting a noise effect, of the selected sequence of noise symbols, on the given received sequence of data symbols. The decoder moreover includes a codeword validator for obtaining a termination condition when the formed symbols comprise a codeword for the inner code. The decoder additionally has a memory for storing, for the given received sequence of data symbols when the termination condition is obtained, the formed symbols as a codeword for the inner code. The decoder further has an outer decoder for collectively decoding, when the memory stores a number k of codewords for the inner code wherein the number k≤m is determined by the outer code, the k stored codewords according to the outer code. The decoder finally includes an outputter for outputting the decoded data.

It is appreciated that the decoder described above is suitable for performing the method described above and its variations. However, it is also appreciated that, in accordance with the concepts, techniques, and systems described herein, other instrumentalities may perform the above method and the above decoder may perform functions other than this method. Moreover, while embodiments have been summarized in terms of a method and decoder, it is appreciated that other embodiments include corresponding manufactures (such as tangible computer-readable media in which are non-transitorily stored executable instructions) that provide various aspects and advantages described herein.

BRIEF DESCRIPTION OF THE DRAWINGS

The manner and process of making and using the disclosed embodiments may be appreciated by reference to the drawings, in which.

DETAILED DESCRIPTION OF ILLUSTRATIVE EMBODIMENTS

In this specification, including the appended claims, the following quoted terms shall have the indicated meanings, except where expressly indicated otherwise:

"Data block" (or "block") means a sequence of symbols.

"Data channel" (or "channel") means a medium or plurality of coupled media for communicating data blocks between one or more data senders and one or more data receivers.

"Codebook" means a set of blocks, or a description of such a set of blocks, shared between the data sender and the data receiver.

"Codeword" means a block in the codebook.

"Oracle" for a codebook means a function or mechanism that enables a device, lacking direct access to all codewords in the codebook, to determine whether any given sequence of symbols is a codeword in the codebook.

"Channel input" means a codeword sent by a data sender into a channel. "Channel output" means a corresponding block received by a data receiver from the channel.

"Noise" means an error caused by transient passage of a block through a channel that results in a channel input being different than the corresponding channel output.

"Noise function" means a function that computes a channel output block by invertibly combining a channel input codeword and a noise block.

When applied to a noisy channel, "memoryless" means that the noise function is determined by a single error probability and "memory" means that the noise function is determined by multiple error probabilities.

A "binary symmetric channel" (or "BSC") is a memoryless channel that is binary (useful signals are encoded using bits) and symmetric (the probability that a bit is altered by noise does not depend on the value of the bit).

Figure 1:
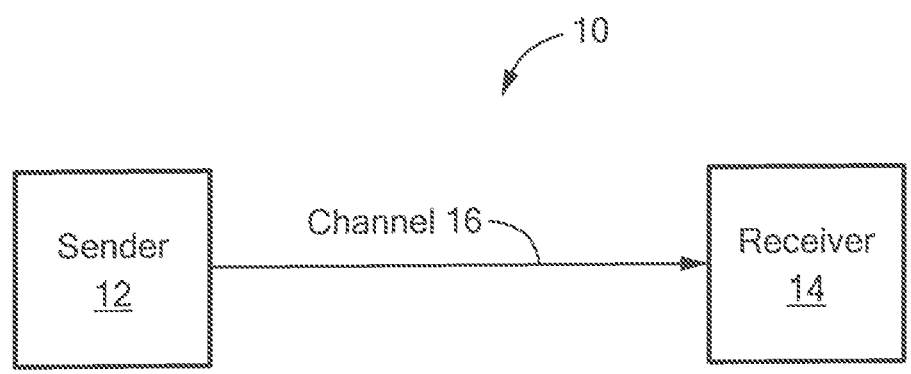
FIG. 1 is a schematic diagram of an illustrative system in which the concepts described herein may be practiced.

Referring now to FIG. 1, an illustrative, simplified environment in which the concepts and techniques described herein may be practiced includes a system 10 for communicating data packets between a sender 12 and a receiver 14 using a data channel 16. The sender 12 may be any device capable of communicating data packets to another device, using the data channel 16. Similarly, the receiver 14 may be any device capable of receiving data packets from another device using the data channel 16. The data channel 16 may be any channel known in the art for communicating data packets, including analog and digital channels, and combinations of such channels including the Internet. Sender 12 and receiver 14 each may have, for example, a structure which is the same as or like processing system 50 shown in FIG. 5.

In operation, the data sender 12 sends data toward the data receiver 14 using the data channel 16. The data receiver 14 can determine whether received data is valid. If the data receiver 14 receives invalid data, then it may assume that noise in the data channel 16 has corrupted the data sent by the data sender 12, and the data receiver 14 must correct the noise. Embodiments of the concepts described herein include systems, devices, and techniques for correcting that noise using the noise guessing techniques illustrated in the remaining Figures and as now described.

In general, the data channel 16 may be modeled using inputs $X^n$ and outputs $Y^n$, each comprising blocks of n symbols from a finite alphabet A of size |A|. It is assumed that the channel input sent by the data sender 12 toward the data receiver 14 is altered by random, not necessarily memoryless, noise, $N^n$, that is independent of the channel input and takes values in $A^n$. If the noise function $\oplus$ describing the channel's action operates as:

$$Y^n = X^n \oplus N^n, \quad (1)$$

and if this function is invertible, then an effect of the noise can be recovered, knowing the output and input, as:

$$X^n = Y^n \ominus N^n. \quad (2)$$

While these equations indicate that the noise function and its inverse are additive, it is contemplated that the noise function $\oplus$ may be more general, and may be, for example, multiplicative. Various embodiments of the concepts described herein require only that the noise function is invertible using a function $\ominus$.

The data sender 12 and data receiver 14 operate using a codebook $\mathcal{C}_n = \{c^{n,1}, \ldots, c^{n,M_n}\}$ consisting of $M_n$ codewords, or elements of $A^n$. The codebook may be extrinsically shared, in which case both the data sender 12 and the data receiver 14 store a copy of the codebook. Alternately, the codebook may be intrinsically shared, in which case both the data sender 12 and the data receiver 14 share an algorithm for determining whether a given element of An is a codeword. In other embodiments, a fixed codebook or algorithm is not shared between the data sender 12 and data receiver 14 but is dynamically computed by the data receiver 14. For example, the block size n, the number of codewords $M_n$, or their values may be varied as a function of a signal-to-noise ratio measured by the data sender 12 or the data receiver 14. In other embodiments, the data receiver 14 does not have direct access to all codewords in the codebook and consults an external codebook oracle to determine whether a given sequence of symbols is a codeword.

For a given channel output $y^n$ received by the data receiver 14, denote the conditional probability of the received sequence for each codeword in the codebook by:

$$p(y^n | c^{n,i}) = P(y^n = C^{n,i} \oplus N^n) \text{ for } i \in \{1, \ldots, M_n\}. \quad (3)$$

The Maximum Likelihood ("ML") decoding is then an element of the codebook that has the highest conditional likelihood of transmission given what was received, $$c^{n,*} \in \operatorname{argmax} \{p(y^n|c^{n,i}); c^{n,i} \in \mathcal{C}_n^i\} = \operatorname{argmax}\{P(N^n = y^n \ominus c^{n,i}); c^{n,i} \in \mathcal{C}_n^i\}, \quad (4)$$

where the invertibility of the operation $\oplus$ has been used in the final equation.

In accordance with illustrative embodiments, a decoder in the data receiver 14 guesses noise rather than a channel input codeword. In one embodiment, the decoder rank-orders noise sequences from most likely to least likely, then sequentially queries whether the sequence that remains when the noise is removed from the received signal is an element of the codebook. The first result that matches the codebook corresponds to the Maximum Likelihood (ML) decoding, with a probability approaching one (1).

More formally, the receiver first creates an ordered list of noise sequences, $G: A^n \to \{1, \ldots, |A|^n\}$, from most likely to least likely, breaking ties arbitrarily:

$$G(z^{n,i}) \le G(z^{n,j}) \text{ iff } P(N^n = z^{n,i}) \ge P(N^n = z^{n,j}), \quad (5)$$

where z is used as n denotes the code block-length. Then, for each received signal, the receiver executes the following process:

1. Given channel output $y^n$, initialize $i=1$ and set $z^n$ to be the most likely noise sequence, i.e. the $z^n$ such that $G(z^n)=i$.
2. While $x^n = y^n \ominus z^n \notin \mathcal{C}_n^i$, increase i by 1 and set $z^n$ to be the next most likely noise sequence, i.e. the $z^n$ such that $G(z^n)=i$.
3. The $x^n$ that results from this while loop is the decoded element.

In some embodiments, list decoding is realized by repeating the second and third steps in the above process, until a given number N of elements of the codebook are identified. This list then constitutes the N most likely transmitted codewords.

Table 1 below illustrates ML decoding by noise guessing. The data receiver 14 generates, or otherwise receives, an ordered list of noise symbols. For example, the receiver may generate a rank-ordered list from most likely to least likely breaking ties arbitrarily, $z^{n,1}$, $z^{n,2}$, and so on. The order may be based on measurements of data channel characteristics, such as a signal-to-noise ratio, an interference ratio, a change in a codeword error rate, and interference between multiple users. The noise guessing order may be determined before communication of meaningful data begins, or dynamically adapted using machine learning techniques known in the art.

of the codebook to be identified need not be selected. In this connection, in some cryptographic applications feedback from the data sender regarding a pattern of noise mixed with the codeword may be used during selection.

The noise guessing approach described herein advantageously separates knowledge of the full codebook from codeword guessing in the decoder. Thus, the decoder only requires the ability to look up codewords, e.g. using a codebook oracle, not to compute with them. This permits significant decoder speed gains through parallelization, and significantly simplifies decoder hardware design.

The ML decoder described above may be advantageously modified using the observation that once enough unsuccessful guesses have been made, it becomes probable that further guesses will not result in successful decoding. In this case, the data receiver 14 optionally may perform an Approximate Maximum Likelihood ("AML") decoding, in which the decoder abandons guessing after some number of noise removal queries and declares an error, which may be implemented as an erasure. Early termination bounds the complexity of the algorithm.

Different options exist for setting the AML abandonment threshold. A predetermined number of queries may be hard coded based on, for example, hardware constraints or to avoid excessive guessing. Or, the threshold may be determined as a function of the noise characteristics of the channel. If H is the Shannon entropy rate of the noise and the query abandonment threshold is set to $|A|^{n(H+\delta)}$ queries for some $\delta > 0$, then it can be shown that an AML decoder is capacity achieving for large n and any value $\delta > 0$, despite not being an ML decoder. In this connection, the abandonment threshold may be chosen to achieve a target abandonment probability. This choice may be advantageously combined with the use of network coding, as described below in connection with FIG. 4.

Figure 2:
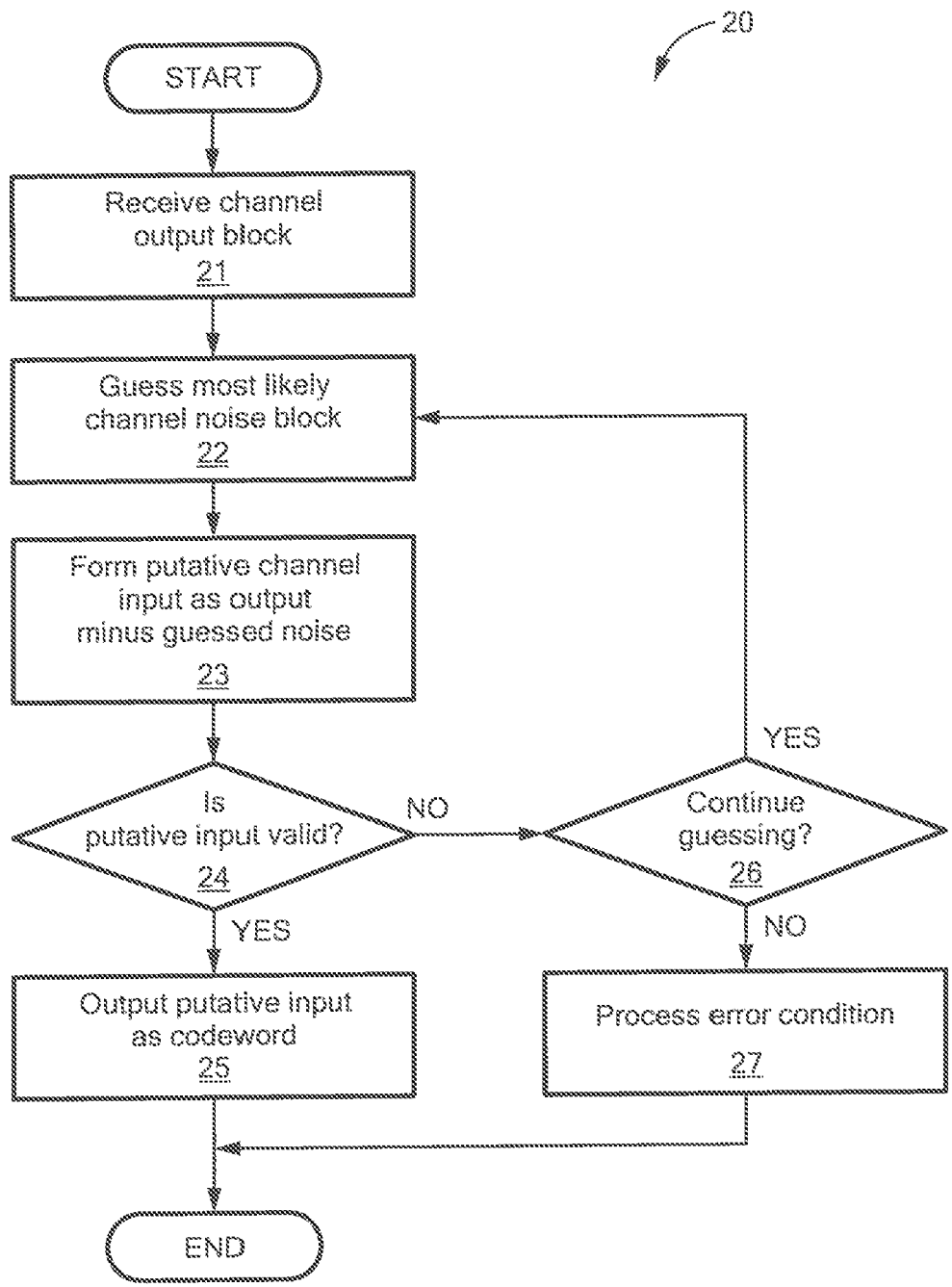
FIG. 2 is a flow diagram for a method of correcting channel noise though noise guessing.

FIG. 2 is a flow diagram which illustrates processing that can be implemented within a device or system such as that illustrated in FIG. 1. Rectangular elements (typified by element 21 in FIG. 2), herein denoted "processing blocks," represent computer software instructions or groups of instructions. Diamond shaped elements (typified by element 24 in FIG. 2), herein denoted "decision blocks," represent computer software instructions, or groups of instructions, which affect the execution of the computer software instructions represented by the processing blocks.

The processing and decision blocks may represent processes or steps performed by functionally equivalent circuits such as a digital signal processor (DSP) circuit or an

TABLE 1

| Noise guessing order | 1 | 2 | 3 | 4 | 5 | 6 | ... |
|---|---|---|---|---|---|---|---|
| Noise from most likely to least likely | $z^{n,1}$ | $z^{n,2}$ | $z^{n,3}$ | $z^{n,4}$ | $z^{n,5}$ | $z^{n,6}$ | ... |
| String queried for membership of the codebook $C_n$ | $y^n \ominus z^{n,1}$ | $y^n \ominus z^{n,2}$ | $y^n \ominus z^{n,3}$ | $y^n \ominus z^{n,4}$ | $y^n \ominus z^{n,5}$ | $y^n \ominus z^{n,6}$ | ... |
| Location of codebook elements | | | $c^{n,i}_1$ | | $c^{n,i}_2$ | | ... |

In that order, given a received signal $y^n$, the data receiver 14 sequentially subtracts the noise $z^{n,i}$ and queries if the string that results, $y^{n,i}$, is an element of the codebook $\mathcal{C}_n$. The first string that is in the codebook is the ML decoding, or an approximation thereof. In this example $c^{n,i}_1$ is the first element of the codebook to be identified, which occurs on the third noise guess. It is appreciated that the first element application specific integrated circuit (ASIC). The flow diagram does not depict the syntax of any programming language, but rather illustrates the functional information of one of ordinary skill in the art requires to fabricate circuits or to generate computer software to perform the required processing. It should be noted that many routine program elements, such as initialization of loops and variables and the use of temporary variables may be omitted for clarity. The sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order or in parallel.

In general overview, FIG. 2 illustrates one method 20 of decoding data, received from a data sender using a noisy data channel, through noise guessing. The data receiver may be, for example, data receiver 14 (FIG. 1), processing device 30 (FIG. 3), computer 50 (FIG. 5), or some other data receiver. The noisy channel may be data channel 16, or some other data channel. The method 20 may be performed by a single data receiver, or by many data receivers in parallel as described below in connection with FIG. 4.

The illustrative method 20 begins with a receiving process 21, in which the data receiver receives a noisy channel output block. The receiving process 21 may be performed using techniques known in the art for receiving data from a channel.

The method 20 continues with a guessing process 22, in which the data receiver "guesses" a channel noise block. To make a guess, the data receiver consults a noise model for which a likelihood estimate for each noise block may be (or has been) computed. The noise model may be probabilistic, for example a Markov model. Alternately, the noise model may be non-probabilistic, and may be determined using machine learning or inference. Of course, other such models may be used in various embodiments. Using this model, the data receiver orders the noise blocks in likelihood order, with the maximum likelihood (ML) noise block first. Thus, in guessing process 22 the data receiver "guesses" the most likely noise block not already guessed.

The decoder may store the ordered noise blocks in a memory indexed by likelihood. This design permits the decoder to determine which noise blocks already have been guessed simply by storing the index number, advantageously reducing decoder complexity. In this way, a guess consists of retrieving the noise block at the index, then incrementing the index. In some embodiments, each of a number N of decoders stores its own index number, and a guess includes incrementing the memory index by N, thus gaining the advantages of parallelization.

In some embodiments, the data receiver may order noise blocks prior to performing the method of FIG. 2. The probability that a codeword will experience a noise error is low for most practical data channels, which are already designed to reduce noise. Thus, the most likely noise block likely is the zero block, and the most likely result is that the received sequence already is a codeword in the codebook.

The next most likely error, for a binary symmetric channel, is likely to be a single-bit error. Thus, the single-bit errors may be the next on the list to "guess". These errors themselves may have a likelihood order. For example, single bit errors at the end of a block may be more likely owing to lack of perfect synchronization between digital clocks of the data sender and data receiver. Thus, the next most likely noise block would be the block beginning with all zeroes and ending with a single 1. It may be appreciated that other orderings are possible, and may be based on channel properties, whether known prior to, or during, performing the method of FIG. 2.

The method 20 continues with a noise reversing process 23, in which the data receiver forms a putative channel input codeword as the received channel output block with the effect of the guessed noise block reversed. Forming the putative channel input codeword may be done using known techniques in the art, such as subtraction circuitry if the noise function is additive. If the block comprises binary symbols, for example, then subtraction circuitry may include an exclusive-or (XOR) circuit.

The method 20 continues with a validity determining process 24, in which the data receiver determines whether the putative channel input codeword is valid. As described above, a codeword is valid when it is contained in the codebook shared between the data sender and the data receiver. Thus, if the codebook is defined extrinsically, the validity determining process 24 may include consulting a codebook memory to determine whether the putative channel input codeword is stored inside. Alternately, if the codebook is defined intrinsically, the validity determining process 24 may include determining whether the output of a binary function on the putative channel input codeword is true or false. Or, the method may not have direct access to the codebook at all, only an oracle indicating whether the putative channel input codeword is valid. In this latter case, the validity determining process 24 may include querying the oracle for validity of the putative channel input codeword.

If the putative channel input codeword is valid, then the method 20 has obtained a termination condition for the loop and continues with an outputting process 25, in which the putative channel input codeword is determined to be the actual channel input codeword and output the codeword as such. Also, once the outputting process 25 is reached, the data receiver has determined the noise block that most satisfactorily explains the received sequence. The outputting process 25 thus optionally includes performing a function using this noise block. For example, the data receiver may store the noise block in a table indexed by received time, and later analyze the data stored in the table to update the ordering of noise blocks by, for example, an estimating technique or calculating a likelihood (e.g. via a maximum likelihood technique). Other techniques may, of course, also be used to update the ordering. Other embodiments of the concepts described herein may use these noise blocks to perform other analyses (i.e. other than updating the ordering of noise blocks), including via machine learning or outputting the noise blocks to other devices to perform online machine learning, thus advantageously obviating the need for a full or explicit statistical description of the noise. In this manner, a decoder (or even a larger system which includes the decoder) is able to learn from the information/data being observed.

If the putative channel input codeword is not valid, then the method 20 continues with a repeat determining process 26, in which the data receiver determines whether to continue guessing. In general, the criterion or criteria to make the determination may be tailored to the requirements of the data receiver or the application. For example, in some embodiments, the data receiver in some embodiments guesses noise blocks in order of decreasing likelihood, and there exists an abandonment point at which further noise guesses are unlikely to provide a correct decoding. Thus, the repeat determining process 26 may include determining whether this abandonment point has been reached, for example by incrementing a repetition counter when (and preferably each time) the codeword validator attempts to validate a formed block of symbols and abandoning the search when the count reaches a maximum repetition threshold.

It is appreciated that some embodiments requiring additional security may be designed based on a decoding rate that corresponds to a noise floor. For example, in some physical environments, channel noise is correlated to physical distance in a predictable, and generally increasing manner. If it is known that an intended receiver is a certain physical distance, or within a range of distances, away from the data sender but that an undesired receiver may be closer to the data sender, the codeword validator may assume a minimum amount of noise and reject low-noise sequences. This corresponds to skipping ahead in the noise guessing order by omitting a minimum threshold number of guesses. Using a noise floor, the desired receiver will obtain for each received sequence of symbols a single codeword having a maximum likelihood of having been transmitted. Meanwhile, the undesired interloper has a greater decoding rate and will therefore obtain several valid codewords but will be unable to correctly decide between them. In this way, natural channel noise is used to enhance security.

If all relevant criteria to continue guessing are met, the method 20 returns to the guessing process 22, to guess the next candidate noise block. Otherwise, the method 20 proceeds to an error handling process 27, in which the data receiver processes the failure to decode as an error condition. The breakeven point for further guesses may be determined as a function of the codebook and the channel properties. The error handling process 27 may include, for example, "decoding" the channel output as an erasure consisting of all zeroes. Alternately or in addition, the error handling process 27 may include producing a high- or low-voltage error or erasure signal on a circuit.

Figure 2A:
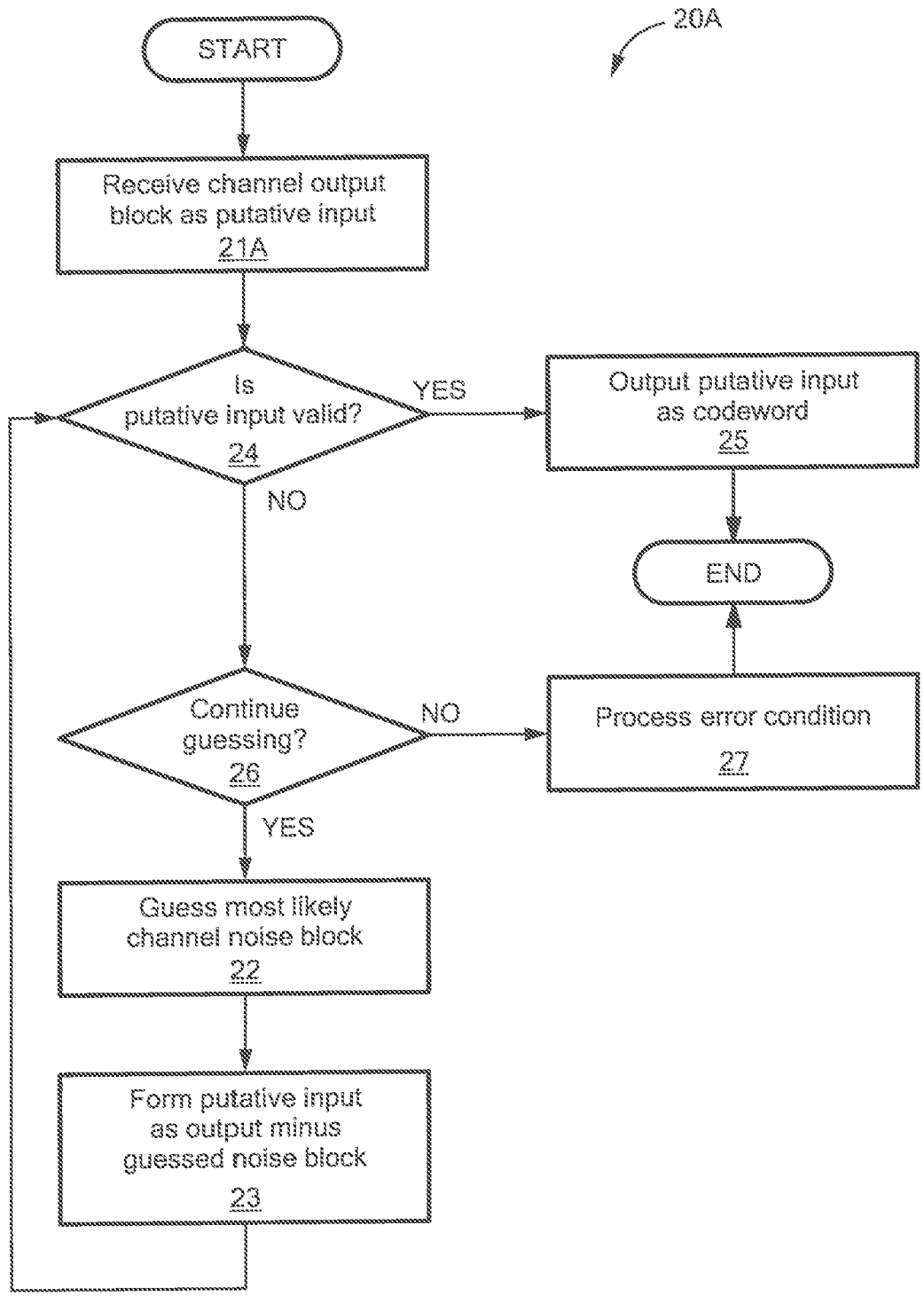
FIG. 2A is a flow diagram for an alternate method of correcting channel noise though noise guessing.

Referring now to FIG. 2A, in which like elements of FIG. 2 are provided having like reference designations, an alternate method 20A is indicated for decoding a signal having a codeword. The method 20A of FIG. 2A is like the method 20 of FIG. 2, except that the processing of FIG. 2A includes determining whether the received channel output block is valid (thereby obtaining the termination condition) before guessing any noise blocks. This approach may streamline or optimize processing, given that the most likely noise block is zero.

Thus, the method 20A begins as shown with a receiving process 21A by receiving a channel output block as a putative channel input codeword. Processing continues to the validity determining process 24, which as above may consult a stored codeword memory, a codeword-generating function, or an external codebook oracle for validity. If the putative channel input codeword is valid, then the method completes with the outputting process 25. If, in the validity determining process 24, a decision is made that the putative channel input codeword is not valid, then the data receiver determines whether to continue guessing with repeat determining process 26. If the data receiver determines to stop guessing, the method 20A concludes with error handling process 27. Otherwise, if the data receiver determines to continue guessing, the method 20A continues with processes 22, 23, and returns to process 24, as in the loop of FIG. 2.

Figure 2B:
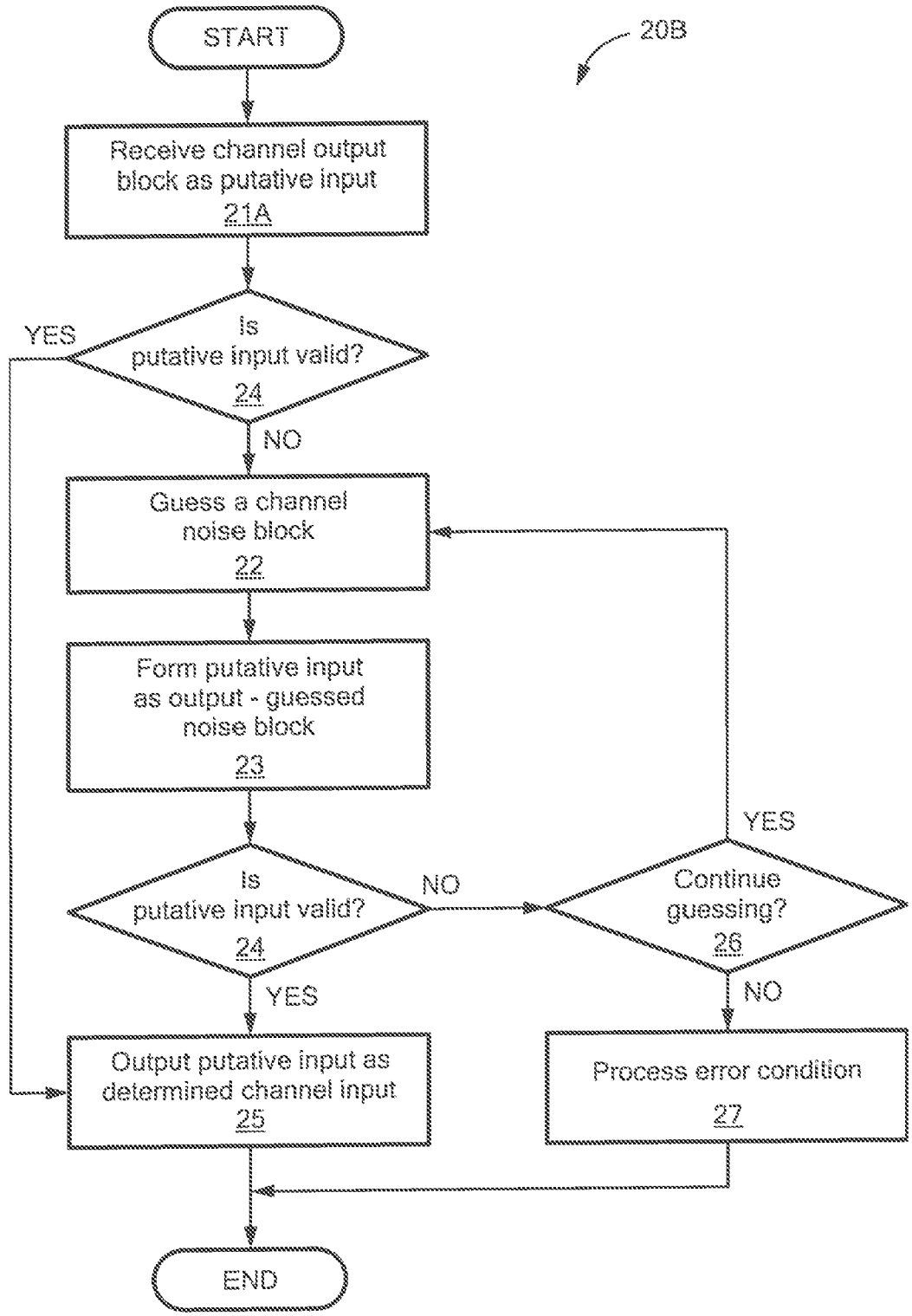
FIG. 2B is a flow diagram of yet another method of correcting channel noise though noise guessing.

Referring now to FIG. 2B in which like elements of FIGS. 2 and 2A are provided having like reference designations, an alternate method 20B is indicated for decoding a signal having a codeword. The method 20B of FIG. 2B is like the method 20A of FIG. 2A, except that when the received channel output block is not valid, the processing of FIG. 2B requires guessing at least one noise block.

Thus, the method 20B begins as shown with receiving process 21A and validity determining process 24, just as in FIG. 2A. If the received channel output signal is valid, then the method 20B has obtained a termination condition and continues to an outputting process 25 and concludes. Otherwise, the received channel output signal is a not valid codeword, and the method 20B continues to the processes 22-27 as described above in conjunction with FIG. 2. In this connection, the processing of FIG. 2B is like that of FIG. 2, which also requires guessing at least one noise block.

Figure 3:
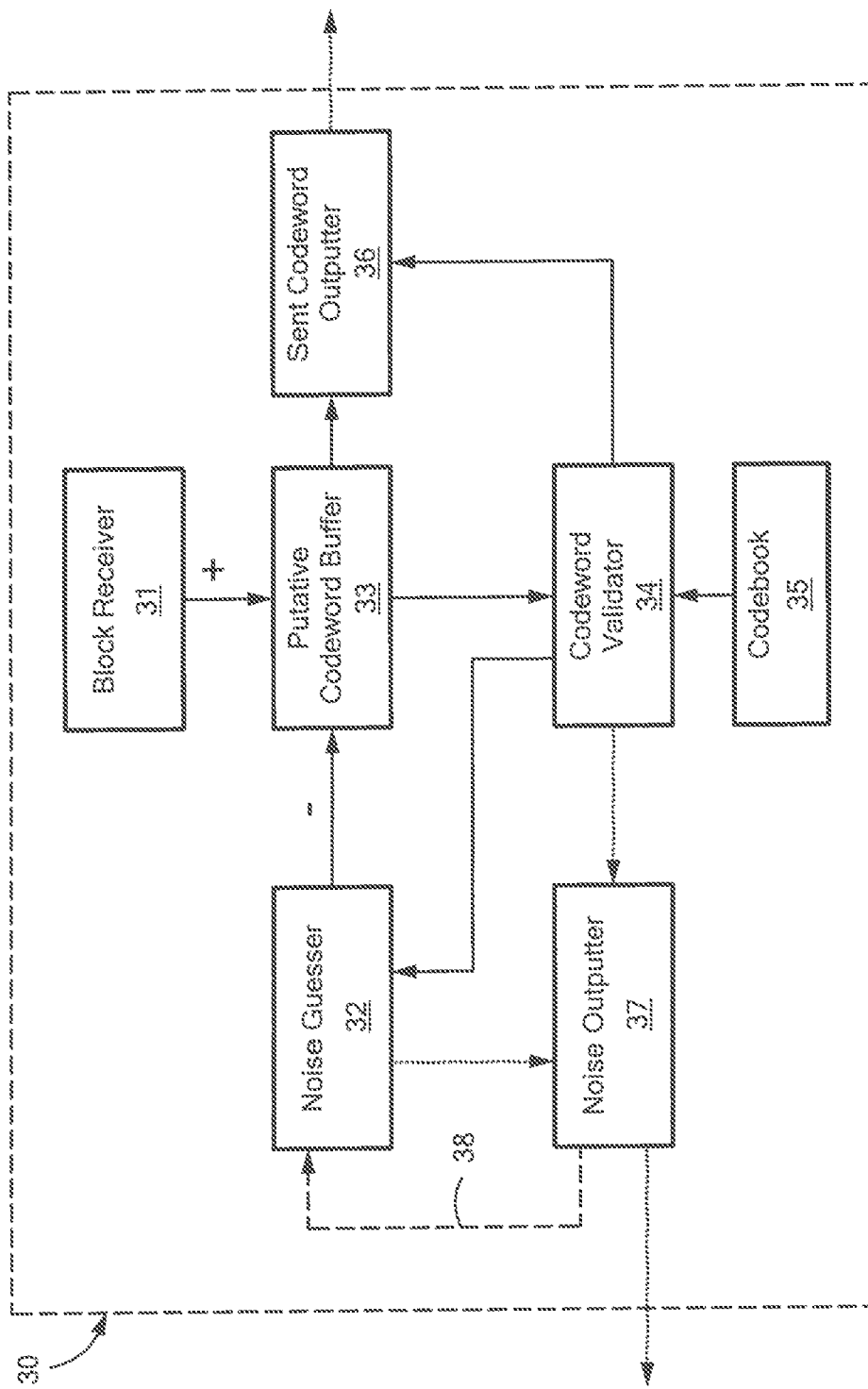
FIG. 3 is a schematic diagram of an illustrative receiving system which utilizes the guessing techniques described herein in conjunction with FIGS. 1-2B.

Referring now to FIG. 3, a device 30 which may, for example, correspond to an ML or AML decoder included in a receiver of the system described above on conjunction with FIG. 1 includes functional components that implement the processes shown in FIGS. 2-2B. Thus, the device 30 may be the data receiver 14, the computer 50 described below, or some other device.

The device 30 includes a block receiver 31 for receiving channel output blocks from a data channel. The block receiver 31 may be, for example, a network interface card (NIC) described below, or similar means. In some embodiments, the block receiver 31 performs the receiving process 21, the receiving process 21A, or both.

The device 30 includes a noise guesser 32 for iteratively guessing noise blocks. The noise guesser 32 may be implemented, for example, using the CPU 511 and primary storage 515 described below, a custom integrated circuit, or similar means. In some embodiments, the noise guesser 32 performs the guessing process 22.

The device 30 includes a putative codeword buffer 33 for transiently storing putative channel inputs. The putative codeword buffer 33 may be, for example, primary storage, a volatile memory, or similar means. In some embodiments, the putative codeword buffer 33 stores the result of the computation of the noise reversing process 23. Thus, the putative codeword buffer 33 stores a channel output block received from the block receiver 31, with the reversed effect of a guessed noise block received from the noise guesser 32, as indicated in FIG. 3.

The device 30 includes a codeword validator 34 for validating putative channel inputs. The codeword validator 34 may be implemented, for example, using a CPU and primary storage, a custom integrated circuit, or similar means. In some embodiments, the codeword validator 34 performs the validity determining process 24. Thus, if the codeword validator 34 determines that the block stored in the putative codeword buffer 33 is valid, it may transmit a "success" signal to the noise guesser 32, and a sent codeword outputter 36 and noise outputter 37 described below. If not, the codeword validator 34 may transmit a "continue" signal to the noise guesser 32 that it should guess a next most likely noise block.

In some embodiments, the codeword validator 34 also performs the repeat determining process 26. Thus, the codeword validator 34 may determine that the device 30 should cease further attempting to guess noise blocks. If so, it may transmit a "failure" signal to the noise guesser 32, the sent codeword outputter 36, and the noise outputter 37.

The device 30 may include an optional codebook 35 for use by the codeword validator 34. The codebook 35 may be implemented, for example, using primary storage, a volatile or non-volatile or programmable memory, or similar means. In some embodiments, the codeword validator 34 uses the codebook 35 to determine whether the block stored in the putative codeword buffer 33 is a valid codeword. If so, the codeword validator 34 transmits the "success" signal described above. In other embodiments, the optional codebook 35 is absent, and the codeword validator 34 performs a computational validation to determine whether the block stored in the putative codeword buffer 33 is valid. If so, the codeword validator 34 generates the "success" signal described above.

The device 30 includes a sent codeword outputter 36 for outputting channel input codewords sent by the data sender, as determined by the codeword validator 34. The sent codeword outputter 36 may be any coupling to another circuit or device (not shown) that performs further processing on the channel input codeword, as determined by the device 30. In some embodiments, the sent codeword outputter 36 performs the outputting process 25. Thus, the sent codeword outputter 36 outputs the block stored in the putative codeword buffer 33 upon receiving a "success" signal from the codeword validator 34.

In some embodiments, the sent codeword outputter 36 performs the error handling process 27. Thus, upon receiving a "failure" signal from the codeword validator 34, the sent codeword outputter 36 indicates the failure to the coupled circuit. Failure may be indicated, for example, by producing a high- or low-voltage error signal on the coupled circuit. Alternately or in addition, the sent codeword outputter 36 may transmit an erasure (e.g. a block of all zeroes or all ones), or "soft" information about the error to the coupled circuit to permit the coupled circuit to diagnose the error. Such soft information may include, for example, a count of how many tries to decode had been performed, or data indicating an ordering of the noise sequences.

The device 30 includes a noise outputter 37 for outputting channel noise blocks, as determined by the codeword validator 34. The noise outputter 37 may be any coupling to another circuit or device (not shown) that performs further processing on the guessed noise block. The noise outputter 37 outputs the guessed noise block upon receiving a "success" signal from the codeword validator 34.

The noise guesser 32 optionally includes a function for analyzing noise blocks, as indicated by the dashed line 38 from the noise outputter 37 to the noise guesser 32. Thus, in addition to outputting the guessed noise block to any coupled circuit, the noise outputter 37 may output the guessed noise block to the noise guesser 32. The noise guesser 32, in turn, may analyze the guessed noise block, for example using machine learning, to learn patterns of the channel noise. The noise guesser 32 may then use these noise patterns to update its noise model and reorder the noise blocks. Such reordering may be accomplished, for example, in accordance with a likelihood order (e.g. a maximum likelihood order), and may be made using an estimation technique or a direct calculation technique. In some embodiments, the analysis includes training, where known input blocks are used to train the receiver on channel noise. Alternately or in addition, the analysis may include includes extrinsic information, such as feedback from the sender or from other decoders, to enable on-the-fly machine learning. The analysis, or a portion thereof, may be performed by a circuit coupled to the noise outputter 37, and the reordered noise guesses may be fed back into the noise guesser 32. Such a design advantageously simplifies the design of the noise guesser 32.

Figure 4:
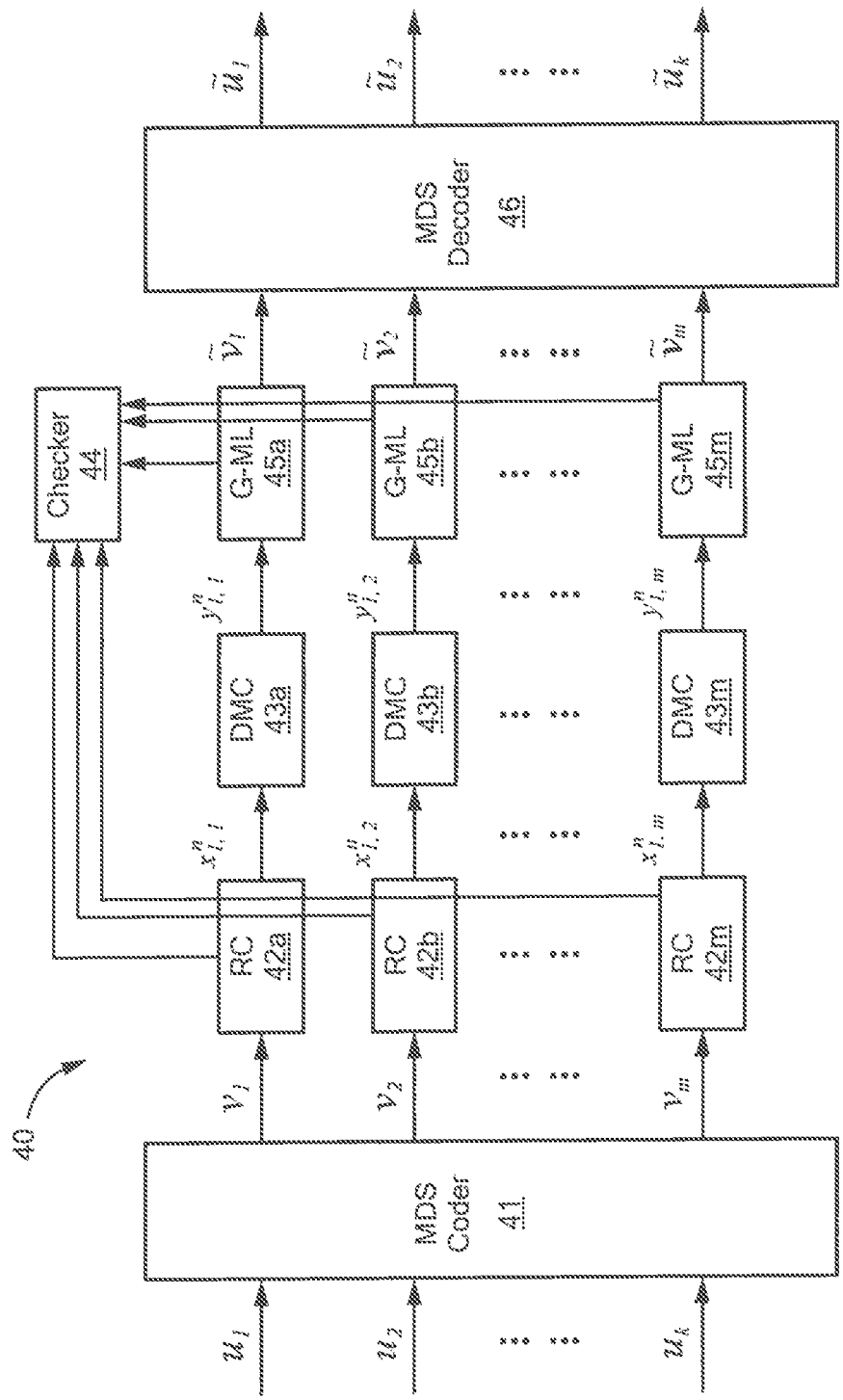
FIG. 4 is a schematic diagram showing the use of concatenating codes in conjunction with FIGS. 1-3.

FIG. 4 is a schematic diagram showing a system 40 using concatenating codes in conjunction with the techniques of FIGS. 1-3. The system 40 may be used, for example, with network coding. In network coding, several nodes are connected in a data communication network by noisy channels (such as data channel 16), and data sent from a data sending node (such as data sender 12) to a data receiving node (such as data receiver 14) passes through several other nodes, some or all of which may reencode the data in a manner that permits reassembly despite the noise.

The system 40 includes a linear channel encoder, such as a Maximum Distance Separable ("MDS") encoder 41. The MDS encoder 41 performs an outer encoding of k blocks of data $u_1, u_2, \ldots, u_k$ in $A^n$ into m blocks of data $v_1, v_2, \ldots, v_m$ using an algebraic encoder, such as a (k, m) Reed-Solomon encoder. Thus, the outer code rate is k/m. Devices and techniques for performing such channel encoding are known in the art. In network coding embodiments, the k input blocks are received in the MDS encoder 41 from k other nodes.

The system 40 also includes inner coders 42a-42m. The number of such inner coders 42 is matched to the number of blocks of data output from the MDS encoder 41. At least one and preferably each inner coder 42a-42m encodes input blocks of data (and preferably each input block of data) using a different code of length n to form a codeword. Devices and techniques for obtaining codes and for encoding with them are known in the art. In some embodiments, the inner coders 42a-42m may be used collectively to perform network coding.

The system 40 also includes discrete memoryless channels ("DMCs") 43a-43m. Some or all of the DMCs 43a-43m may, for example, include a binary symmetric channel ("BSC"), or some other DMC known in the art. The DMCs 43a-43m represent a collection of paths between two nodes in a network. The codeword x output from each inner coder 42a-42m is transmitted by the data sending node using the DMCs 43a-43m. ML decoding as described above achieves channel capacity for such channels when uniformly-random codebooks are used; therefore, each inner coder 42a-42m may encode data using a different random code, so the system 40 may use Random Linear Network Coding (RLNC).

The system 40 also includes a checker 44. The checker 44 is a mechanism used by the data receiving node to determine whether received data (i.e., the received blocks y) are valid. Thus, the checker 44 may be a codebook (such as codebook 35 of FIG. 3), or a codebook oracle, or other such mechanism. The checker 44 coordinates encoding and decoding between the data sending node and data receiving node respectively, as indicated. Thus, in one embodiment, the checker 44 includes a collection of different, random codebooks, or specifications for such codebooks, and provides encoding services to inner coders 42a-42m and validation services to inner decoders 45a-45m, now described.

In accordance with various embodiments of the concepts described herein, at least one or each inner decoder 45a-45m may be a noise guessing ML or AML decoder as described above in connection with FIGS. 1-3. Thus, at least one or each inner decoder 45a-45m may use the checker 44 as an external codebook oracle to determine whether its respectively received block y (with or without noise inversion) is, in fact, a codeword, in a manner like the validity determining process 24. The output of each inner decoder 45a-45m is an inner ML decoding of the respectively received block y.

The system 40 also includes an MDS decoder 46. The MDS decoder 46 performs an outer decoding of m ML decoded codewords to produce an ML decoding of the k blocks of original input data. Devices and techniques for performing such channel decoding are known in the art. Thus, for example, a (k, m) Reed-Solomon code is capable of correcting m−k codeword erasures or codeword validation errors. The above-described code is merely illustrative, and it should be appreciated that other types of outer codes may be used. Thus, the outer code may be a rateless code or another linear network code.

The above-described system provides a significant advantage over syndrome decoding for linear block codes since by guessing noise in at least one and preferably each ML or AML decoder 45a-45m, no syndrome computations are required. Moreover, noise accumulated, aggregated or otherwise joined over several hops worth may be corrected by one (i.e. a single) or more inner decoder 45a-45m. Additive noise adds across multiple hops through a data network. If the data sending node is not the original data sender, but an intermediary in the data network, then the input data u may contain additive noise from upstream transmission. The fact that RLNC schemes are linear means that this noise is additively present in the outputs x of the outer MDS encoder 41. One or all of inner decoders 45a-45m therefore may use an additive noise model, with less noise being more likely, to produce its ML or AML decoding. For the same reasons, any number of stacked linear codes may be applied to the initial source data with the same corrective results, even outside the network coding context.

Further optimizations are possible as a result. For example, an intermediate node in the data network need not expend the computational power to decode network-coded data all the way back to a codeword prior to performing RLNC encoding. Rather, the input data may be combined using the RLNC scheme and immediately forwarded to the next m nodes without decoding. In some embodiments, this optimization means that nodes in the data network must perform decoding only when they are acting as final data receiving nodes—when they are merely forwarding data, they perform RLNC encoding (which is computationally inexpensive), but not decoding (which is relatively expensive).

These embodiments may include, for example, fiber wireless systems having multiple antennas. Such systems provide different paths for data to travel; each antenna may decode the inner code but not the outer code, trusting the eventual decoder to handle any inner code erasures generated by an antenna relay. Other embodiments advantageously may perform, by the intermediate nodes, recoding of the outer code, e.g. using RLNC, or generate erasures if the channel is noisy, even though such an intermediate node cannot even theoretically perform a complete decoding because it has not received enough encoded data to do so. This result is due to the linear nature of such encoding schemes. Such embodiments may include transmission channels that incorporate multiple paths, each path receiving partial data. Generally, these illustrative embodiments demonstrate end-to-end concatenated coding that tolerates erasures.

Figure 5:
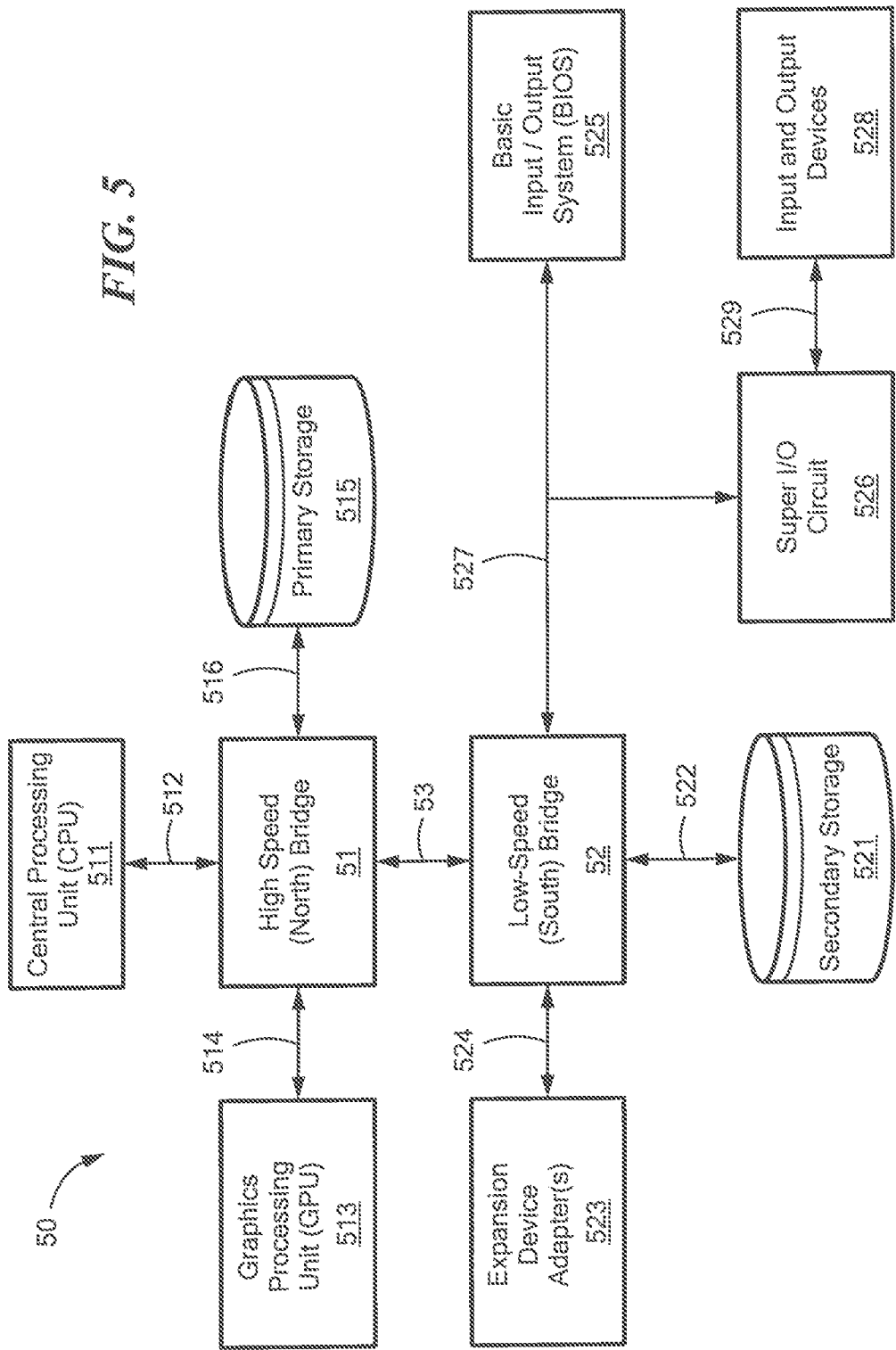
FIG. 5 is a schematic diagram of an illustrative processing system which may execute at least portions of the processing described above in conjunction with FIGS. 1-4.

FIG. 5 schematically shows relevant physical components of a computer processing system 50 embodiment of the concepts described herein, and their respective relationships. Generally, the computer 50 has many functional components that communicate data with each other using data buses. The functional components of FIG. 5 are physically arranged based on the speed at which each must operate, and the technology used to communicate data using buses at the necessary speeds to permit such operation.

Thus, the computer 50 is arranged as high-speed components and buses 511-519 and low-speed components and buses 521-529. The high-speed components and buses 511-519 are coupled for data communication using a high-speed bridge 51, also called a "northbridge," while the low-speed components and buses 521-529 are coupled using a low-speed bridge 52, also called a "southbridge."

The computer 50 includes a central processing unit ("CPU") 511 coupled to the high-speed bridge 51 via a bus 512. The CPU 511 is electronic circuitry that carries out the instructions of a computer program. As is known in the art, the CPU 511 may be implemented as a microprocessor; that is, as an integrated circuit ("IC"; also called a "chip" or "microchip"). In some embodiments, the CPU 511 may be implemented as a microcontroller for embedded applications, or according to other embodiments known in the art.

The bus 512 may be implemented using any technology known in the art for interconnection of CPUs (or more particularly, of microprocessors). For example, the bus 512 may be implemented using the HyperTransport architecture developed initially by AMD, the Intel QuickPath Interconnect ("QPI"), or a similar technology. In some embodiments, the functions of the high-speed bridge 51 may be implemented in whole or in part by the CPU 511, obviating the need for the bus 512.

The computer 50 includes one or more graphics processing units (GPUs) 513 coupled to the high-speed bridge 51 via a graphics bus 514. Each GPU 513 is designed to process commands from the CPU 511 into image data for display on a display screen (not shown). In some embodiments, the CPU 511 performs graphics processing directly, obviating the need for a separate GPU 513 and graphics bus 514. In other embodiments, a GPU 513 is physically embodied as an integrated circuit separate from the CPU 511 and may be physically detachable from the computer 50 if embodied on an expansion card, such as a video card. The GPU 513 may store image data (or other data, if the GPU 513 is used as an auxiliary computing processor) in a graphics buffer.

The graphics bus 514 may be implemented using any technology known in the art for data communication between a CPU and a GPU. For example, the graphics bus 514 may be implemented using the Peripheral Component Interconnect Express ("PCI Express" or "PCIe") standard, or a similar technology.

The computer 50 includes a primary storage 515 coupled to the high-speed bridge 51 via a memory bus 516. The primary storage 515, which may be called "main memory" or simply "memory" herein, includes computer program instructions, data, or both, for use by the CPU 511. The primary storage 515 may include random-access memory ("RAM"). RAM is "volatile" if its data are lost when power is removed, and "non-volatile" if its data are retained without applied power. Typically, volatile RAM is used when the computer 50 is "awake" and executing a program, and when the computer 50 is temporarily "asleep", while non-volatile RAM ("NVRAM") is used when the computer 50 is "hibernating"; however, embodiments may vary. Volatile RAM may be, for example, dynamic ("DRAM"), synchronous ("SDRAM"), and double-data rate ("DDR SDRAM"). Non-volatile RAM may be, for example, solid-state flash memory. RAM may be physically provided as one or more dual in-line memory modules ("DIMMs"), or other, similar technology known in the art.

The memory bus 516 may be implemented using any technology known in the art for data communication between a CPU and a primary storage. The memory bus 516 may comprise an address bus for electrically indicating a storage address, and a data bus for transmitting program instructions and data to, and receiving them from, the primary storage 515. For example, if data are stored and retrieved 64 bits (eight bytes) at a time, then the data bus has a width of 64 bits. Continuing this example, if the address bus has a width of 32 bits, then $2^{32}$ memory addresses are accessible, so the computer 50 may use up to $8*2^{32}=32$ gigabytes (GB) of primary storage 515. In this example, the memory bus 516 will have a total width of 64+32=96 bits. The computer 50 also may include a memory controller circuit (not shown) that converts electrical signals received from the memory bus 516 to electrical signals expected by physical pins in the primary storage 515, and vice versa.

Computer memory may be hierarchically organized based on a tradeoff between memory response time and memory size, so depictions and references herein to types of memory as being in certain physical locations are for illustration only. Thus, some embodiments (e.g. embedded systems) provide the CPU 511, the graphics processing units 513, the primary storage 515, and the high-speed bridge 51, or any combination thereof, as a single integrated circuit. In such embodiments, buses 512, 514, 516 may form part of the same integrated circuit and need not be physically separate. Other designs for the computer 50 may embody the functions of the CPU 511, graphics processing units 513, and the primary storage 515 in different configurations, obviating the need for one or more of the buses 512, 514, 516.

The depiction of the high-speed bridge 51 coupled to the CPU 511, GPU 513, and primary storage 515 is merely illustrative, as other components may be coupled for communication with the high-speed bridge 51. For example, a network interface controller ("NIC" or "network adapter") may be coupled to the high-speed bridge 51, for transmitting and receiving data using a data channel, such as data channel 16. The NIC may store data to be transmitted to, and received from, the data channel 16 in a network data buffer.

The high-speed bridge 51 is coupled for data communication with the low-speed bridge 52 using an internal data bus 53. Control circuitry (not shown) may be required for transmitting and receiving data at different speeds. The internal data bus 53 may be implemented using the Intel Direct Media Interface ("DMI") or a similar technology.

The computer 50 includes a secondary storage 521 coupled to the low-speed bridge 52 via a storage bus 522. The secondary storage 521, which may be called "auxiliary memory", "auxiliary storage", or "external memory" herein, stores program instructions and data for access at relatively low speeds and over relatively long durations. Since such durations may include removal of power from the computer 50, the secondary storage 521 may include non-volatile memory (which may or may not be randomly accessible).

Non-volatile memory may comprise solid-state memory having no moving parts, for example a flash drive or solid-state drive. Alternately, non-volatile memory may comprise a moving disc or tape for storing data and an apparatus for reading (and possibly writing) the data. Data may be stored (and possibly rewritten) optically, for example on a compact disc ("CD"), digital video disc ("DVD"), or Blu-ray disc ("BD"), or magnetically, for example on a disc in a hard disk drive ("HDD") or a floppy disk, or on a digital audio tape ("DAT"). Non-volatile memory may be, for example, read-only ("ROM"), write-once read-many ("WORM"), programmable ("PROM"), erasable ("EPROM"), or electrically erasable ("EEPROM").

The storage bus 522 may be implemented using any technology known in the art for data communication between a CPU and a secondary storage and may include a host adaptor (not shown) for adapting electrical signals from the low-speed bridge 52 to a format expected by physical pins on the secondary storage 521, and vice versa. For example, the storage bus 522 may use a Universal Serial Bus ("USB") standard; a Serial AT Attachment ("SATA") standard; a Parallel AT Attachment ("PATA") standard such as Integrated Drive Electronics ("IDE"), Enhanced IDE ("EIDE"), ATA Packet Interface ("ATAPI"), or Ultra ATA; a Small Computer System Interface ("SCSI") standard; or a similar technology.

The computer 50 also includes one or more expansion device adapters 523 coupled to the low-speed bridge 52 via a respective one or more expansion buses 524. Each expansion device adapter 523 permits the computer 50 to communicate with expansion devices (not shown) that provide additional functionality. Such additional functionality may be provided on a separate, removable expansion card, for example an additional graphics card, network card, host adaptor, or specialized processing card.

Each expansion bus 524 may be implemented using any technology known in the art for data communication between a CPU and an expansion device adapter. For example, the expansion bus 524 may transmit and receive electrical signals using a Peripheral Component Interconnect ("PCI") standard, a data networking standard such as an Ethernet standard, or a similar technology.

The computer 50 includes a basic input/output system (BIOS) 525 and a Super I/O circuit 526 coupled to the low-speed bridge 52 via a bus 527. The BIOS 525 is a non-volatile memory used to initialize the hardware of the computer 50 during the power-on process. The Super I/O circuit 526 is an integrated circuit that combines input and output ("I/O") interfaces for low-speed input and output devices 528, such as a serial mouse and a keyboard. In some embodiments, BIOS functionality is incorporated in the Super I/O circuit 526 directly, obviating the need for a separate BIOS 525.

The bus 527 may be implemented using any technology known in the art for data communication between a CPU, a BIOS (if present), and a Super I/O circuit. For example, the bus 527 may be implemented using a Low Pin Count ("LPC") bus, an Industry Standard Architecture ("ISA") bus, or similar technology. The Super I/O circuit 526 is coupled to the I/O devices 528 via one or more buses 529. The buses 529 may be serial buses, parallel buses, other buses known in the art, or a combination of these, depending on the type of I/O devices 528 coupled to the computer 50.

After reading the disclosure provided herein, it should now be appreciated that the techniques and structures described herein may be implemented in any of a variety of different forms. For example, features of the concepts described herein may be embodied within various forms of communication devices, both wired and wireless; television sets; set top boxes; audio/video devices; laptop, palmtop, desktop, and tablet computers with or without wireless capability; personal digital assistants (PDAs); telephones; pagers; satellite communicators; cameras having communication capability; network interface cards (NICs) and other network interface structures; base stations; access points; integrated circuits; as instructions and/or data structures stored on machine readable media; and/or in other formats. Examples of different types of machine readable media that may be used include floppy diskettes, hard disks, optical disks, compact disc read only memories (CD-ROMs), digital video disks (DVDs), Blu-ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data.

In the foregoing detailed description, various features of the invention are grouped together in one or more individual embodiments for streamlining the disclosure. This method of disclosure is not to be interpreted as reflecting an intention that the claimed concepts described herein require more features than are expressly recited in each claim. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. A method comprising, at a data receiver:
receiving a channel codeword from a data sender over a noisy data channel;
generating a plurality of candidate error patterns, the plurality of candidate error patterns comprising a plurality of one-bit error patterns and a plurality of multiple-bit error patterns generated from the plurality of one-bit error patterns;
evaluating the plurality of candidate error patterns for codebook membership, based on the channel codeword; and
outputting an estimated codeword when a codebook membership constraint is satisfied for a given candidate error pattern.

2. The method of claim 1, wherein generating the plurality of candidate error patterns comprises:
computing a plurality of one-bit noise sequences associated with the plurality of one-bit error patterns;
storing the plurality of one-bit noise sequences; and
combining the plurality of one-bit noise sequences to generate the plurality of multiple-bit error patterns.

3. The method of claim 2, wherein evaluating the plurality of candidate error patterns for codebook membership comprises:
combining a candidate error pattern with the channel codeword; and
assessing whether the codebook membership constraint is satisfied for the combination.

4. The method of claim 3, wherein combining the candidate error pattern with the channel codeword comprises using an exclusive-or (XOR) circuit.

5. The method of claim 4, wherein the codebook membership constraint is satisfied when at least one output of the XOR circuit is logical zero.

6. The method of claim 1, wherein the plurality of candidate error patterns is evaluated for codebook membership sequentially.

7. The method of claim 1, wherein the plurality of candidate error patterns is evaluated for codebook membership in parallel.

8. A data receiver comprising:
a receiving unit configured for receiving a channel codeword from a data sender over a noisy data channel;
an error pattern generation unit configured for generating a plurality of candidate error patterns, the plurality of candidate error patterns comprising a plurality of one-bit error patterns and a plurality of multiple-bit error patterns generated from the plurality of one-bit error patterns;
a codebook membership evaluation unit configured for evaluating the plurality of candidate error patterns for codebook membership, based on the channel codeword; and
an output unit configured for outputting an estimated codeword when a codebook membership constraint is satisfied for a given candidate error pattern.

9. The data receiver of claim 8, wherein the error pattern generation unit is configured for generating the plurality of candidate error patterns by:
computing a plurality of one-bit noise sequences associated with the plurality of one-bit error patterns;
storing the plurality of one-bit noise sequences; and
combining the plurality of one-bit noise sequences to generate the plurality of multiple-bit error patterns.

10. The data receiver of claim 9, wherein the codebook membership evaluation unit is configured for evaluating the plurality of candidate error patterns for codebook membership by: combining a candidate error pattern with a syndrome of the channel codeword, and assessing whether the codebook membership constraint is satisfied for the combination.

11. The data receiver of claim 10, wherein the codebook membership evaluation unit is configured for combining the candidate error pattern with the syndrome of the channel codeword using an exclusive-or (XOR) circuit.

12. The data receiver of claim 11, wherein the codebook membership evaluation unit is configured to determine that the codebook membership constraint is satisfied when at least one output of the XOR circuit is logical zero.

13. The data receiver of claim 8, wherein the codebook membership evaluation unit is configured for evaluating the plurality of candidate error patterns for codebook membership sequentially.

14. The data receiver of claim 8, wherein the codebook membership evaluation unit is configured for evaluating the plurality of candidate error patterns for codebook membership in parallel.

* * * * *